United States Patent
Gregg et al.

(10) Patent No.: US 11,249,153 B2
(45) Date of Patent: Feb. 15, 2022

(54) ACOUSTIC EXCITATION AND DETECTION OF SPIN WAVES

(71) Applicant: Oxford University Innovation Limited, Oxford (GB)

(72) Inventors: John Francis Gregg, County Wicklow (IE); Tsz Cheong Fung, Hong Kong (CN); Burkard Hillebrands, Kaiserslautern (DE)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 251 days.

(21) Appl. No.: 16/461,393

(22) PCT Filed: Nov. 14, 2017

(86) PCT No.: PCT/GB2017/053424
§ 371 (c)(1),
(2) Date: May 16, 2019

(87) PCT Pub. No.: WO2018/091879
PCT Pub. Date: May 24, 2018

(65) Prior Publication Data
US 2020/0064418 A1    Feb. 27, 2020

(30) Foreign Application Priority Data

Nov. 18, 2016   (GB) .................................... 1619559

(51) Int. Cl.
*G01R 33/12* (2006.01)
*H01L 41/04* (2006.01)
(Continued)

(52) U.S. Cl.
CPC .......... *G01R 33/1284* (2013.01); *H01L 41/04* (2013.01); *H03B 15/006* (2013.01); *H01F 10/24* (2013.01)

(58) Field of Classification Search
CPC ......... H01L 41/04; H01L 41/00; H01L 43/00; H01L 41/12; H03B 15/006; H01F 10/24;
(Continued)

(56) References Cited

U.S. PATENT DOCUMENTS 3,530,302 A   9/1970  Morgenthaler
3,530,409 A   9/1970  Vasile
(Continued)

FOREIGN PATENT DOCUMENTS

| EP | 3 089 227 A1 | 11/2016 |
| WO | 2012/121230 A1 | 9/2012 |
| WO | WO-2012121230 A1 * | 9/2012 | ............. H01L 41/00 |

OTHER PUBLICATIONS

Chowdhury et al., "Parametric Amplification of Spin Waves Using Acoustic Waves," IEEE Transactions on Magnetics (vol. 51, Issue: 11, Nov. 2015) (Chowdhury). (Year: 2015).*
English machine translation of Uchida et al. WO 2012/121230 (Uchida) from corresponding application JP 5907492 (Year: 2012).*
International Search Report & Written Opinion for PCT/GB2017/053424, dated Feb. 5, 2018, pp. 1-10.
(Continued)

*Primary Examiner* — Lee E Rodak
(74) *Attorney, Agent, or Firm* — Thomas|Horstemeyer, LLP

(57) ABSTRACT

Apparatus for generating spin waves comprising a body (102) of magnetic material and an elastic wave generator (120), wherein the body (102) has a surface (108) and the elastic wave generator (120) is arranged to transmit elastic waves so that they propagate through the body (102) towards the surface (108) and are reflected at the surface to form a standing elastic wave in the body (102), thereby generating spin waves.

16 Claims, 11 Drawing Sheets

(51) Int. Cl.
*H03B 15/00* (2006.01)
*H01F 10/24* (2006.01)

(58) Field of Classification Search
CPC .... B82Y 25/00; B82Y 10/00; G01R 33/1284; G01R 33/18; G01R 33/0325; G01R 33/0327; G01R 33/075; G01R 33/096
See application file for complete search history.

(56) References Cited

U.S. PATENT DOCUMENTS

2009/0085695 A1* 4/2009 Srinivasan ............. H01P 1/215
 333/219.2
2016/0322955 A1* 11/2016 Rottenberg ............. G01B 7/24

OTHER PUBLICATIONS

UK Search Report for GB1619559.6, dated Apr. 11, 2017, pp. 1-4.
ArXiv, M. Weiler et al., Feb. 17, 2012, "spin pumping with coherent elastic waves", https://arxiv.org/pdf/1110.1187.pdf. pp. 1-8.
Cherepov Sergiy et al: "Electric-field-induced spin wave generation using multiferroic magnetoelectric cells", Applied Physics Letters, A I P Publishing LLC, US, vol. 104, No. 8, Feb. 24, 2014 (Feb. 24, 2014).
Khitun Alexander et al: "Non-volatile magnonic logic circuits engineering", Journal of Applied Physics, American Institute of Physics, US, vol. 110, No. 3, Aug. 1, 2011 (Aug. 1, 2011), pp. 34306-1-34306-II.
International Preliminary Report on Patentability for PCT/GB2017/053424, dated May 21, 2019, pp. 1-7.

* cited by examiner

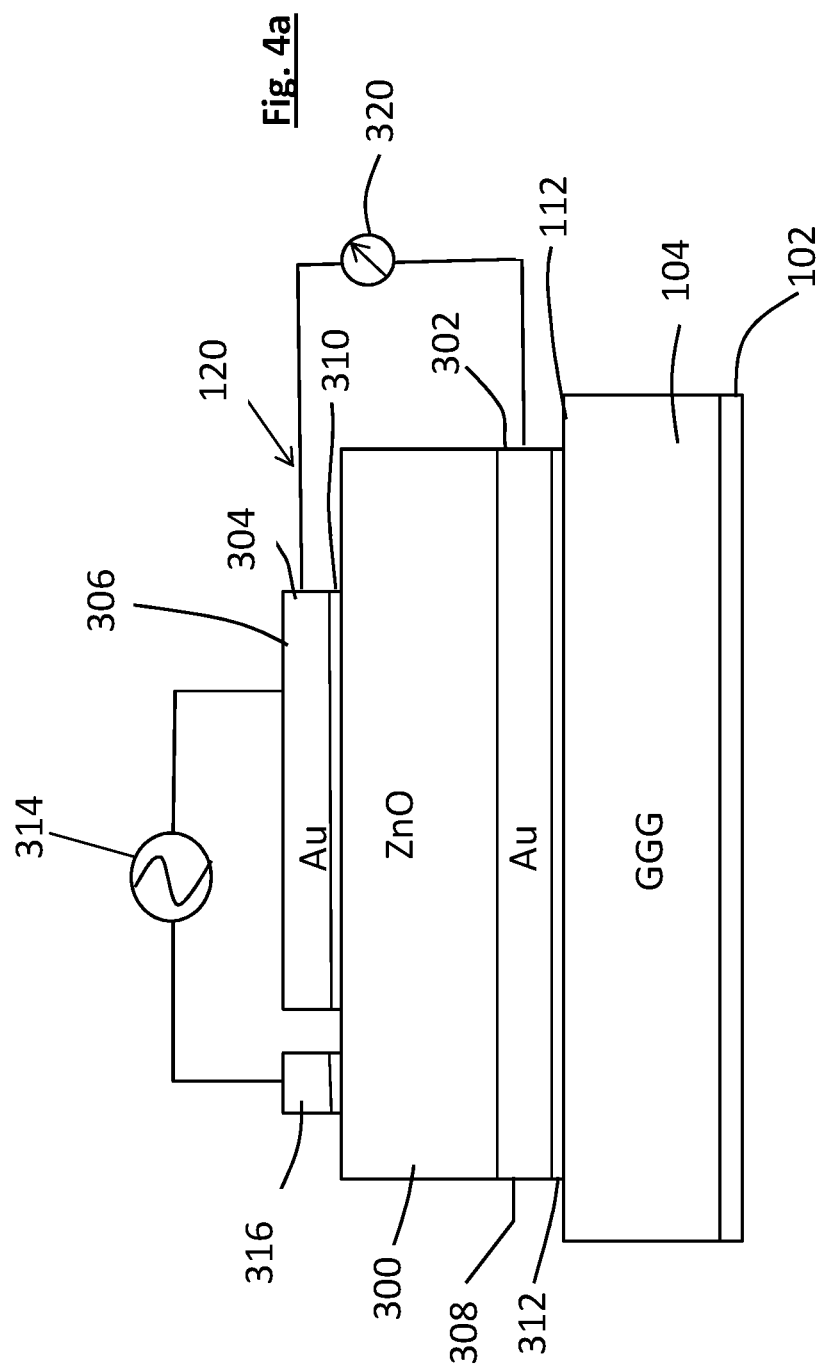

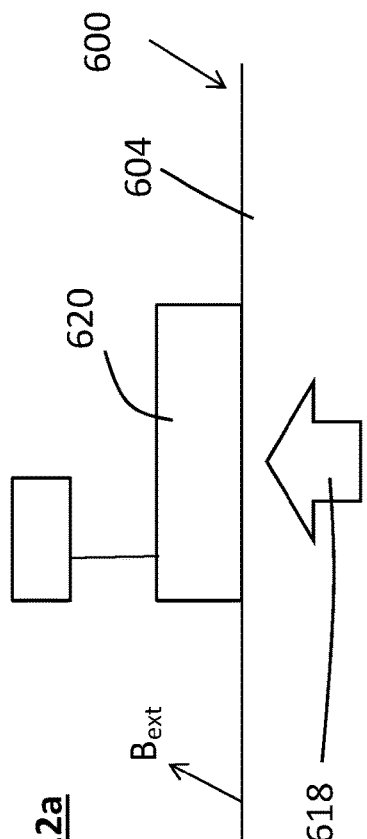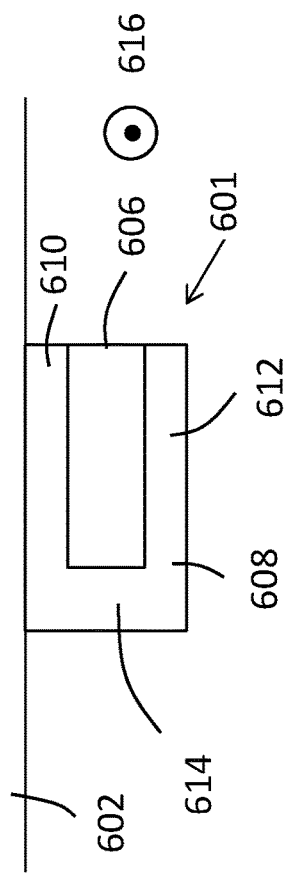

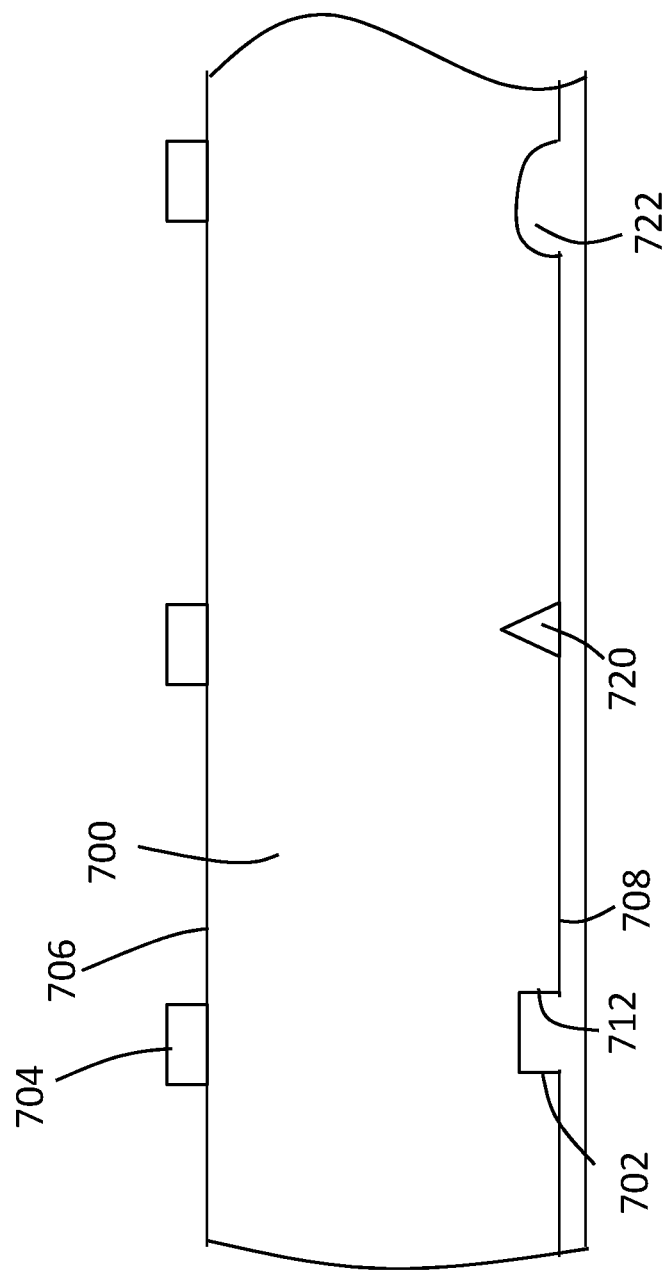

ACOUSTIC EXCITATION AND DETECTION OF SPIN WAVES

CROSS-REFERENCE TO RELATED APPLICATIONS

This application is the National Stage of International Application No. PCT/GB2017/053424, filed Nov. 14, 2017, which claims the priority to GB 1619559.6, filed Nov. 18, 2016, which are entirely incorporated herein by reference.

FIELD OF THE INVENTION

The present invention relates to the generation and detection of spin-waves, and in particular to acoustic systems for such generation and detection.

BACKGROUND TO THE INVENTION

Spin waves correspond to the phase-coherent precession of coupled magnetic spins of electrons in magnetically ordered materials. FIG. 1 illustrates the precessing spins of a spin-wave in a 1-D chain. The spins are precess coherently and angular momentum is transferred as the wave propagates. The quanta of spin waves are called magnons. Magnonics, a fusion of the words "magnon" and "electronics", refers to the use of spin waves to transmit, store, and process information. By contrast with electronic signal processing in semiconductors which requires use of charge currents, magnonics has potential advantages. Magnons, as data carriers for computing devices, offer Joule-heat-free spin information transfer and operate at high frequency, typically in the GHz regime, where their micron sized wavelengths are conducive to progressive device miniaturization.

The GHz frequency spin-wave spectrum is traditionally divided into three regions: the magnetostatic or dipole region, the dipole-exchange region, and the exchange region. The wavelengths of the excitations get progressively shorter moving from the magnetostatic region to the exchange region. The dynamics of magnetostatic spin waves (MSW) are dominated by long-range dipole-dipole interaction between the ordered spins. In a magnon waveguide with lateral dimensions comparable with the wavelength of the spin-waves, the magnetic boundary conditions give rise to a diversity of dispersion relations. The ease with which these dispersion relations may be controlled and modified by tuning the amplitude and/or direction of the applied magnetic field underpins numerous technological applications.

The most common means by which to excite MSWs in magnetic waveguides employs narrow strip-line antennae. In this technique, a high-frequency current is passed through the antennae, giving rise to a magnetic field which couples to the magnetic structure of the waveguide material, launching a wave. This technique is simple and practical to implement but suffers from three limitations: owing to the linear geometry, punctual MSW excitation is not possible, the requirement for significant charge current makes the process power-hungry and heat generating, and the antenna geometry is not easily scalable to the nanometre scale on which information processing will eventually need to function.

SUMMARY OF THE INVENTION

The present invention provides apparatus for generating spin waves comprising a body of magnetic material and an elastic wave generator, wherein the body has a surface and the elastic wave generator is arranged to transmit elastic waves so that they propagate through the body towards the surface and are reflected at the surface, thereby generating spin waves. The reflection of the elastic waves may be arranged to form a standing elastic wave in the body.

The spin waves may be magnetostatic (dipole) spin waves, dipole-exchange spin waves, or exchange spin waves.

The body may comprise a film having two opposite surfaces. The elastic wave generator may be arranged to transmit elastic waves in a direction perpendicular to the surfaces. The wavelength of the elastic wave may be in the order of the film thickness to enable efficient magnon pulse excitation. For example the thickness of the film may be in the range from 0.25 to 6.0 times the elastic wavelength. In some cases it may be preferable that the elastic wave has a wavelength in the range from 0.5 to 2 times the thickness of the film.

The elastic wave propagation direction may be perpendicular to the surfaces of the film.

The film may be narrow, for example in the form of a strip, so as to form a 1-dimensional waveguide in which spin waves can propagate in one dimension along the length of the waveguide. However the film may extend in two dimensions so as to form a two-dimensional waveguide, in which spin waves can propagate in two dimensions, for example in at least two orthogonal directions.

The film may be formed on a substrate. The elastic wave generator may be formed on the opposite side of the substrate to the film.

The surface may have a surface feature therein. The elastic wave generator may be arranged to transmit the elastic waves so that they propagate in a propagation direction towards the surface feature. The elastic waves may be reflected at the surface. The elastic waves may interact with the surface feature to generate spin waves.

The apparatus may further comprise a further material extending over the surface. The further material may have a different acoustic refractive index than the body.

The apparatus may further comprise a further material extending over the surface feature. The further material extending over the surface and the further material extending over the surface feature may be the same material.

The further material may have a pronounced spin-orbit interaction, for example it may be gold.

The surface feature may be a recess in the surface. The surface feature may have a maximum dimension of no more than 100 nm, or no more than 10 nm.

The elastic wave generator may be a piezoelectric device. The device may comprise a piezoelectric element and two electrodes arranged to apply an electric field across the piezoelectric element to generate the elastic waves.

The two electrodes may be on opposite sides, e.g. on opposing surfaces, of the piezoelectric element. Alternatively the two electrodes may be on the same side of the piezoelectric element and arranged to have an oscillating voltage applied between them, and a further electrode may be provided on the opposite side of the piezoelectric element so that capacitive coupling between the further electrode and one of said two electrodes produced an electric field across the piezoelectric element.

The apparatus may further comprise a DC voltage source arranged to apply a variable DC electric field to the piezoelectric element thereby to shift the phase of the elastic waves.

The apparatus may comprise a phase shifting device located between the elastic wave generator and the body of magnetic material. The phase shifting device may be arranged to move the elastic wave generator, for example to vary the distance between the elastic wave generator and the body of magnetic material. This may shift the phase of elastic waves, for example at one or more surfaces of the waveguide. The phase shifting device may comprise a piezoelectric element and electrodes to which a voltage can be applied to vary a dimension of the piezoelectric element.

The invention further provides a method of generating spin waves comprising providing a body of magnetic material having a surface, applying a magnetic field to the magnetic material, and transmitting elastic waves so that they propagate through the body towards the surface and are reflected at the surface to form a standing elastic wave in the body, thereby generating spin waves.

The elastic waves may be generated using a piezoelectric device comprising a piezoelectric element and two electrodes arranged to apply an electric field across the piezoelectric element to generate the elastic waves. The method may further comprise applying a varying DC electric field to the piezoelectric element thereby to shift the phase of the elastic waves and the MSWs.

The present invention further provides apparatus for generating elastic waves from spin waves, the apparatus comprising a waveguide along which spin waves can propagate, a piezoelectric element, two electrodes located on opposite sides of the piezoelectric element, and an electrical connection between the two electrodes, wherein the piezoelectric element and the electrodes are mounted on the waveguide so that propagation of spin waves along the waveguide will generate an oscillating electrical voltage across the piezoelectric element to generate an elastic wave.

The apparatus may further comprise an elastic wave detector arranged to detect the elastic wave thereby to generate a detection signal.

The piezoelectric element and the elastic wave detector may be located on opposite sides of the waveguide so that the elastic wave will propagate through the waveguide between the piezoelectric element and the elastic wave detector.

The invention further provides a method of detecting spin waves in a waveguide, the method comprising providing a piezoelectric element and a pair of electrodes located on opposite sides of the piezoelectric element, and detecting variations in the electric potential between the electrodes thereby to detect the spin waves.

The invention further provides apparatus for generating elastic waves from spin waves, the apparatus comprising a waveguide in which spin waves can propagate, and a magnetostrictive element formed on the surface of the waveguide, whereby elastic deformation resulting from a spin wave propagating along the waveguide in the vicinity of the magnetostrictive element will generate an elastic wave propagating through the waveguide.

The apparatus may further comprise an elastic wave detector arranged to detect the elastic wave. The elastic wave detector may comprise a piezoelectric device comprising a piezoelectric element and two electrodes arranged to detect a varying electric field in the piezoelectric element.

The elastic wave detector may be arranged opposite the magnetostrictive element on the opposing surface of the waveguide.

The apparatus may further comprise any one or more features of the preferred embodiments of the invention which are shown in the accompanying drawings, as will now be described in more detail by way of example only.

BRIEF DESCRIPTION OF THE DRAWINGS

FIG. 4a is a cross sectional view through a piezoelectric elastic wave generator according to an embodiment of the invention;

FIGS. 12a and 12b show the cross sectional views of two different designs of MSW detectors; and FIG. 13 is a schematic view of a MSW generator according to a further embodiment of the invention.

DESCRIPTION OF THE PREFERRED EMBODIMENTS

Figure 1:
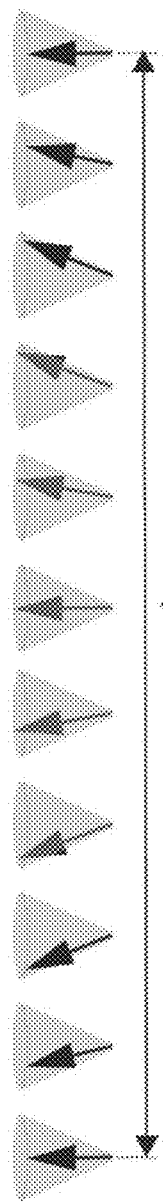
FIG. 1 is a schematic representation of spin waves.
Figure 2:
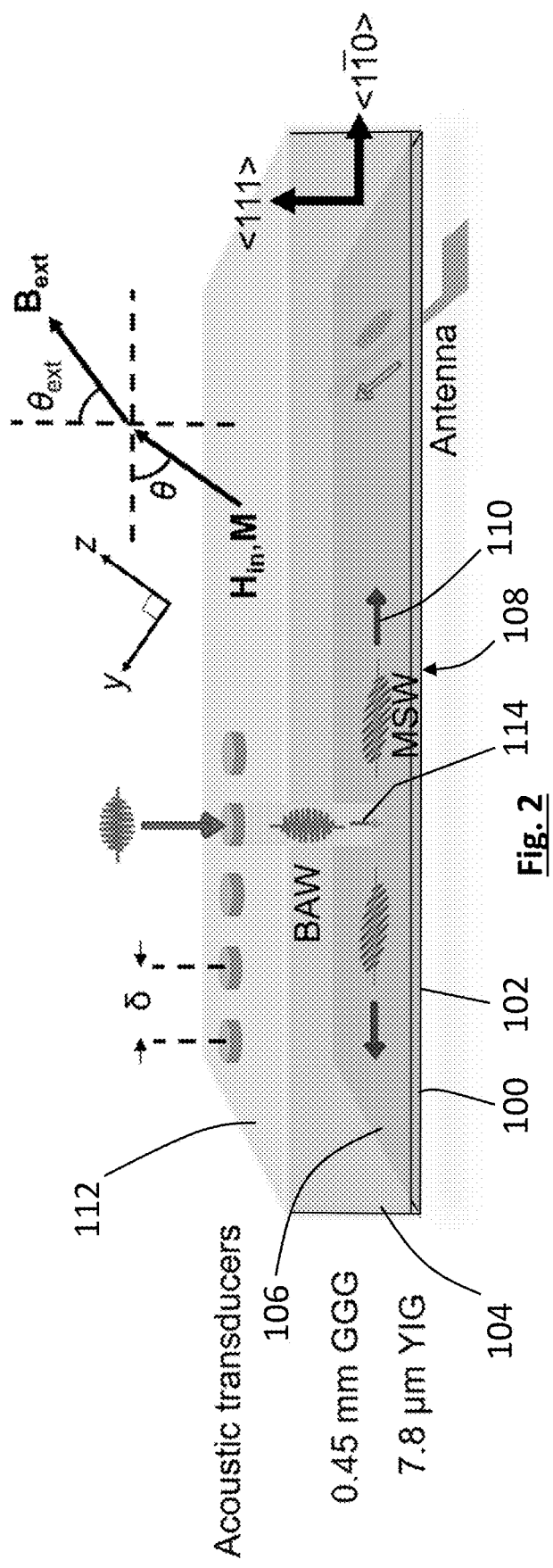
FIG. 2 is schematic view of an apparatus according to an embodiment of the invention for generating MSWs.

Referring to FIG. 2, a magnon launcher according to the invention comprises a magnetic material 100, such as yttrium iron garnet (YIG), with an external magnetic field $B_{ext}$ applied to it so that magnetostatic spin waves (MSWs) can propagate through it. Other spin waves, such as exchange spin waves can also propagate through the magnetic material 100, and where MSWs are referred to specifically herein this should be taken to refer to spin waves generally where the context allows. The magnetic material 100 may be in the form of a layer or film 102 which may be formed on a substrate 104 so that it has an inner surface 106 which is in contact with the substrate 104 and an outer surface 108 which is parallel to the inner surface 106. The external magnetic field $B_{ext}$ may be at some angle $\theta_{ext}$ to the normal to surfaces 106, 108. The layer 102 of magnetic material 100 may form a waveguide along which MSWs can propagate. For example, the magnetic material 100 may be a high quality monocrystalline YIG thin film grown by liquid phase epitaxy. The substrate 104 may be formed of Gadolinium Gallium Garnet (GGG). The YIG film in the embodiment of FIG. 2 is 7.8 µm thick and the GGG substrate 104 is 0.45 mm thick. The external magnetic field $B_{ext}$ will produce an internal magnetic field $H_{in}$ within the magnetic material 100 which will be at some angle $\theta$ to the surfaces 106, 108. The waveguide 102 may be in the form of a strip. The waveguide 102 may form a 1-dimensional waveguide, in which the MSW propagates along the length of the waveguide 102. Alternatively the waveguide 102 may extend significantly in two dimensions forming a 2-dimensional waveguide, in which case MSWs can in general propagate in a range of directions within the two-dimensional plane of the waveguide, although there are some directions in which propagation is not possible. The magnetic material may have a cubic crystal lattice, for example if it is YIG. The <111> crystal axis of the magnetic material may be perpendicular to the outer surface 108 of the waveguide 102. The <1$\bar{1}$0> axis may be parallel to the direction 110 in which MSW propagates.

An ultrasonic transducer 120, which may be a piezoelectric transducer, for example formed of ZnO, is arranged to transmit elastic waves in the form of bulk acoustic waves (BAWs) into the magnetic material 100. The transducer 120 may be grown at the back side 112 of the substrate 104, i.e. on the opposite side of the substrate 104 to the waveguide 102. The transducer is arranged to transmit the BAWs in a BAW propagation direction, which is the direction in which they will propagate into the waveguide, as shown by the arrow 114 in FIG. 2. The BAW propagation direction may be perpendicular to the outer surface 108, and the inner surface 106, of the waveguide 102. The BAW propagation direction may therefore be perpendicular to the propagation direction (or directions) 110 of the MSWs in the waveguide. In this configuration, volume MSWs, i.e. spin-wave modes that are active (non-decaying) throughout the whole ferrite region can be excited. When the internal magnetic field $H_{in}$ is perpendicular to the inner and outer surfaces 106, 108 of the waveguide 102, the spin-wave has positive group velocity meaning that it is in the same direction as that of the phase velocity. Such spin-wave modes are known as the forward volume magnetostatic spin-waves (FVMSW). In contrast, when the magnetic field $H_{in}$ is pointing parallel to the inner and outer surfaces 106, 108 of the waveguide 102, backward volume magnetostatic spin-waves (BVMSW) with their phase velocities opposite to the group velocities can exist. If the external magnetic field is pointing at an arbitrary angle $\theta_{ext}$ to the normal of the plane, both FVMSW and BVMSW types can propagate simultaneously in the waveguide 102.

Figure 3:
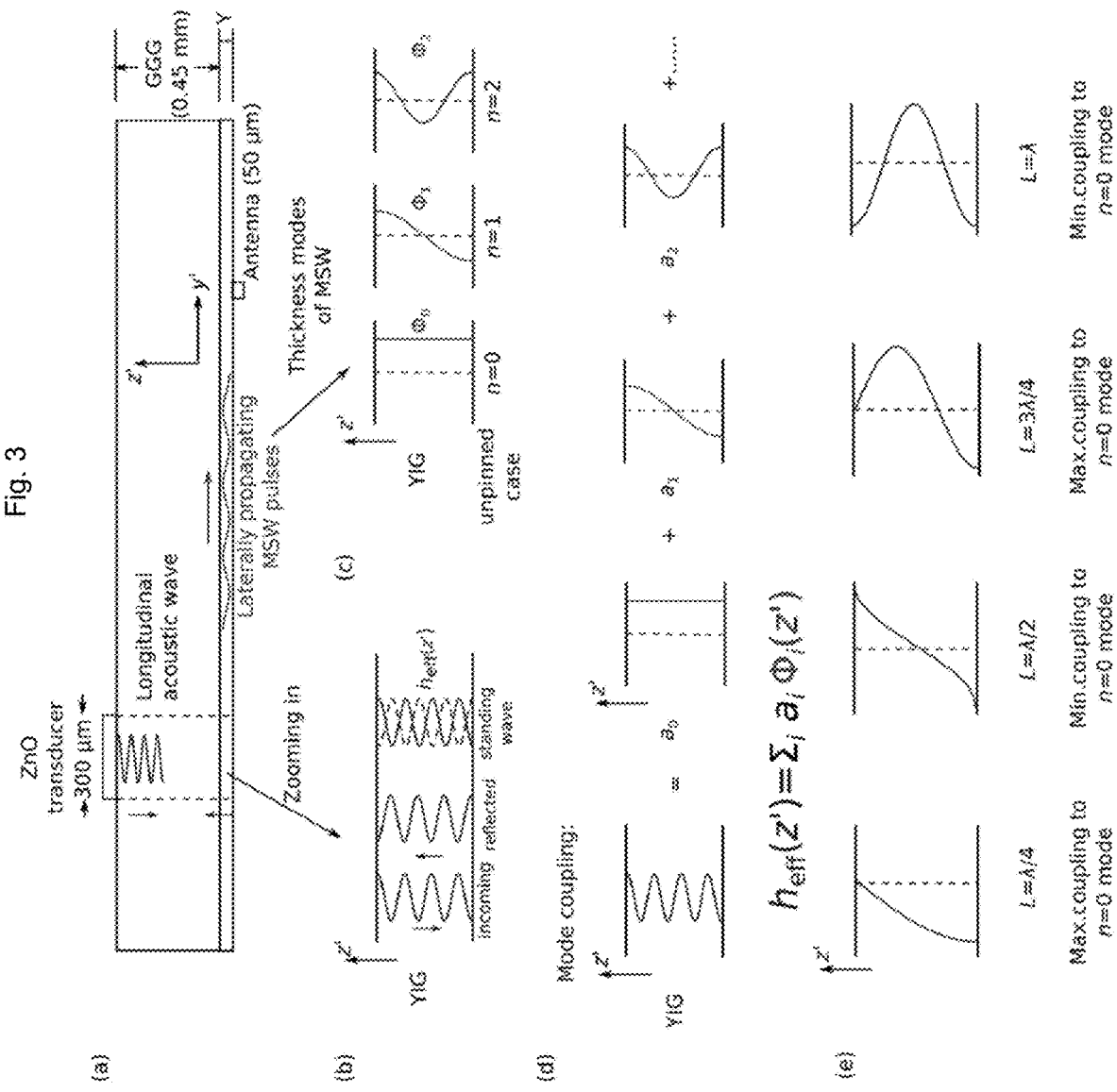
FIGS. 3a to e show the requirements for coupling of elastic waves with MSWs in embodiments of the invention.

In order for the elastic waves generated in the waveguide 102 to generate MSWs there has to be coupling between the elastic waves and the MSWs. The requirements for effective coupling will now be described with reference to FIG. 3. In FIG. 3a, the waveguide 102, substrate 104 and transducer 120 of FIG. 2 are shown. Assuming that the acoustic impedances of the substrate 104 and the waveguide 102 are similar, and different to that if air (or any coating that may be applied to the waveguide), then elastic waves generated by the transducer 120 will be reflected at the outer surface 108 of the waveguide and a standing wave can be set up in the waveguide 102 as shown in FIG. 3b. The oscillating magnetic field generated by the acoustic standing wave due to magnetoelastic coupling is then mode coupled to the MSWs. FIG. 3c shows the various modes of possible MSWs in the waveguide 102, assuming the unpinned condition in which the amplitude of the MSWs is at a maximum at both the inner and outer surfaces 106, 106 of the waveguide. The n=0 mode, in which the MSW has a constant amplitude across the thickness of the waveguide, is the most easily detected using an antenna. The higher mode is when the MSW has varying amplitude across the thickness of the waveguide. The odd mode is where the MSW amplitude is equal and opposite at the two surfaces 106, 108 of the waveguide. The even mode is where the MSW amplitude is equal at the two surfaces 106, 108 of the waveguide. Referring to FIG. 3d, in principle, the oscillating magnetic field caused by acoustic disturbance can couple to infinite family of modes, however, the higher modes have lower excitation efficiencies owing to their low MSW speeds, hence only the lowest order mode (n=0) mode is excited. Referring to FIG. 3e, in theory, the maximum coupling to the n=0 mode MSWs is where the thickness L of the waveguide 102 is an odd number of quarter wavelengths of the elastic waves, i.e. L=λ/4, L=3λ/4, L=5λ/4 where λ is the elastic wavelength in the waveguide. Therefore the waveguide should preferably have a thickness which is close to an odd multiple of a quarter of the wavelength of the elastic waves in the body, or which differs from an odd multiple of a quarter of the wavelength of the elastic waves in the body by no more than one eighth of that wavelength. This puts the thickness closer to the optimum thickness than to the least optimum thickness. In practice, the propagation of spin waves does not reduce to zero at the theoretical minima, and provided the thickness of the waveguide is of the order of the wavelength of the acoustic wave, spin waves can be successfully generated. For example the thickness of the waveguide may in the range from 0.25 to 4 times the acoustic wavelength, or in the range from 0.5 to 2 times the acoustic wavelength.

It will be appreciated that, if the size of the transducer is large relative to the wavelength of the MSWs then there will be destructive interference between the MSWs generated at different points across that volume in the MSW propagation direction. Therefore, the transducer 120 can only be used to generate MSWs that have a wavelength greater than the diameter of the transducer.

Referring to FIG. 4 the transducer 120 may comprise a layer 300 of piezoelectric material, such as zinc oxide, between two electrodes 302, 304. One of the electrodes 302 may be formed on the substrate 104, with the piezoelectric material 300 formed on that electrode 302, and the other electrode 304 formed on the piezoelectric layer 300. One of the electrodes 302 may therefore be between the substrate 104 and the piezoelectric layer 300, and the other electrode 304 may be on the opposite side of the piezoelectric layer to the substrate 104. Each of the electrodes 302, 304 may comprise a main layer 306, 308 of metal, preferably highly conductive such as gold, and may comprise a further layer 310, 312 of a further metal, such as chromium, which may act as an adhesive agent preventing the main layer 306, 308 from peeling away due to intrinsic stress. The electrodes should be made as thin as possible so as to avoid mass loading, but in reality thin electrodes tend to be porous and less conductive. Therefore, the gold layer 306, 308 may be, for example, 25 nm thick, and the chromium layer may be, for example 4 nm thick. The piezoelectric layer may be of the order of 1000 nm thick, and the diameter of the transducer may be around 300-500 μm, but can be miniaturised to nm scale using lithography.

A variable voltage source may be connected between the top and bottom electrodes 302, 304 and the voltage applied between them oscillated to generate elastic waves. However, as shown in FIG. 3, the top electrode 304 may be grounded and connected via the voltage source 314 to a further top electrode 316, having the same layer structure, which is isolated from ground and forms a signal electrode, to which the varying voltage (relative to the grounded electrode) is applied. The signal electrode 316 may be significantly smaller than the grounded top electrode 304, which may be of a similar size to the bottom electrode 302. The bottom electrode, which may have no direct connection to ground, may then be coupled to the grounded top electrode 304 by a large capacitance, making it effectively grounded also, so that an oscillating voltage applied between the two top electrodes 306, 316 produces an oscillating potential difference between the signal electrode 316 and the bottom electrode 302 which generates elastic waves from the piezoelectric layer 300.

This structure with two top electrodes 304, 316 means that the bottom electrode 302 does not need to be connected to the electrical supply, which avoids the need for post-deposition lithography to expose the bottom electrode for connection. This saves time and cost and avoids the possibility of such lithography damaging the piezoelectric film 300.

A further advantage of piezoelectric transducers is that they can be used to modulate the phase of the elastic waves that they generate, and hence also of the MSWs generate. This may be achieved by applying a variable DC power supply 320 to apply a variable DC voltage across the piezoelectric element 300, either using the electrodes 302, 304 which are also used for the elastic wave generation, as shown in FIG. 4, or using separate electrodes. Varying this DC voltage changes the thickness of the piezoelectric element 300, and therefore varies the distance of the effective point of generation of the elastic waves from the waveguide 102. This therefore varies the phase of MSWs at any point along the waveguide relative to the phase of the oscillating voltage used to generate the elastic waves. A similar effect may be obtained by providing a further piezoelectric layer between that 300 used to generate the elastic waves and the waveguide, for example on the surface of the substrate 104, with electrodes on either side of it so that its thickness can be varied by applying the variable DC voltage across it. Indeed, in such a structure which is a modified version of that of FIG. 4, the inner electrode 302 of the device of FIG. 4 could serve also as one of the electrodes for the variable DC voltage.

Figure 4B:
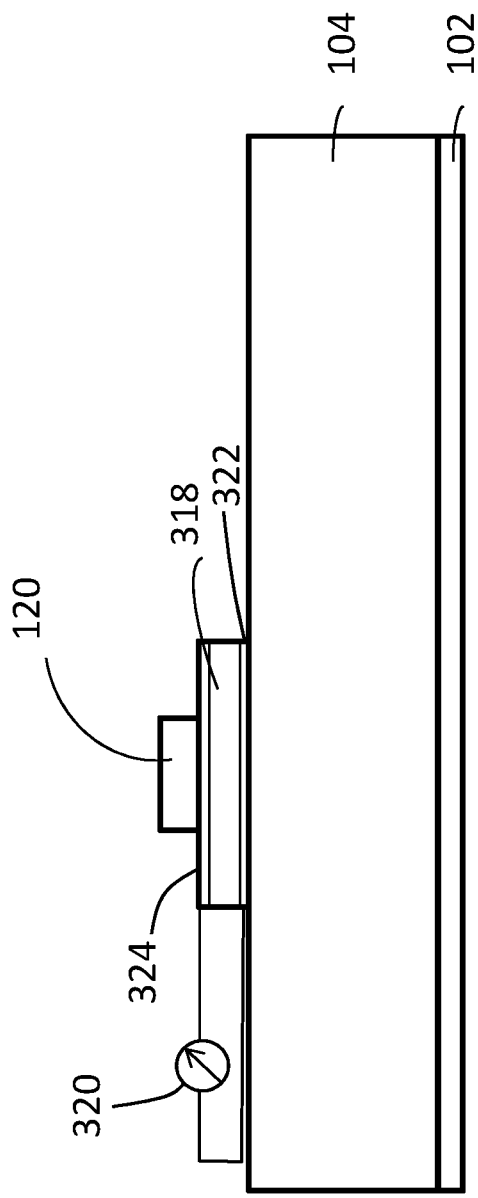
FIG. 4b is a cross sectional view of a piezoelectric elastic wave generator according to a further embodiment of the invention.

Referring to FIG. 4(b) to achieve a similar phase modulation effect, a second piezoelectric element 318 such as quartz may be deposited underneath the first piezoelectric element 120 which is used to generate the elastic wave. This second piezoelectric element 318 may have electrodes 324, 322 on its top and bottom surfaces. One of the electrodes 322 may therefore be between the substrate 104 and the second piezoelectric element 318, and the other of the electrodes 324 may be between the second piezoelectric element 318 and first piezoelectric element 120. The variable DC supply 320 may then be connected between the electrodes 322, 324 so that variation in the DC voltage from the supply 320 causes a variation in the thickness of the second piezoelectric element 318, which shifts the phase of the elastic waves generated in the substrate 104 and the waveguide 102 by the first piezoelectric element 120.

The transducer 120 may be arranged to operate in the GHz range of frequencies, for example from 1 to 10 GHz. For the transducer 120 to function effectively at these frequencies and to be made on length scales suitable for magnonics systems, it is important for the piezoelectric material to be of high quality. If ZnO is used, then a suitable method of forming the ZnO layer is magnetron sputtering. Magnetron sputtering can be performed using either a DC or an RF electrical supply. As ZnO is a semiconductor an RF sputtering system may be used, operating for example at 13.56 MHz which applies an oscillating voltage to the target relative to the metal walls of the vacuum chamber.

Figure 5:
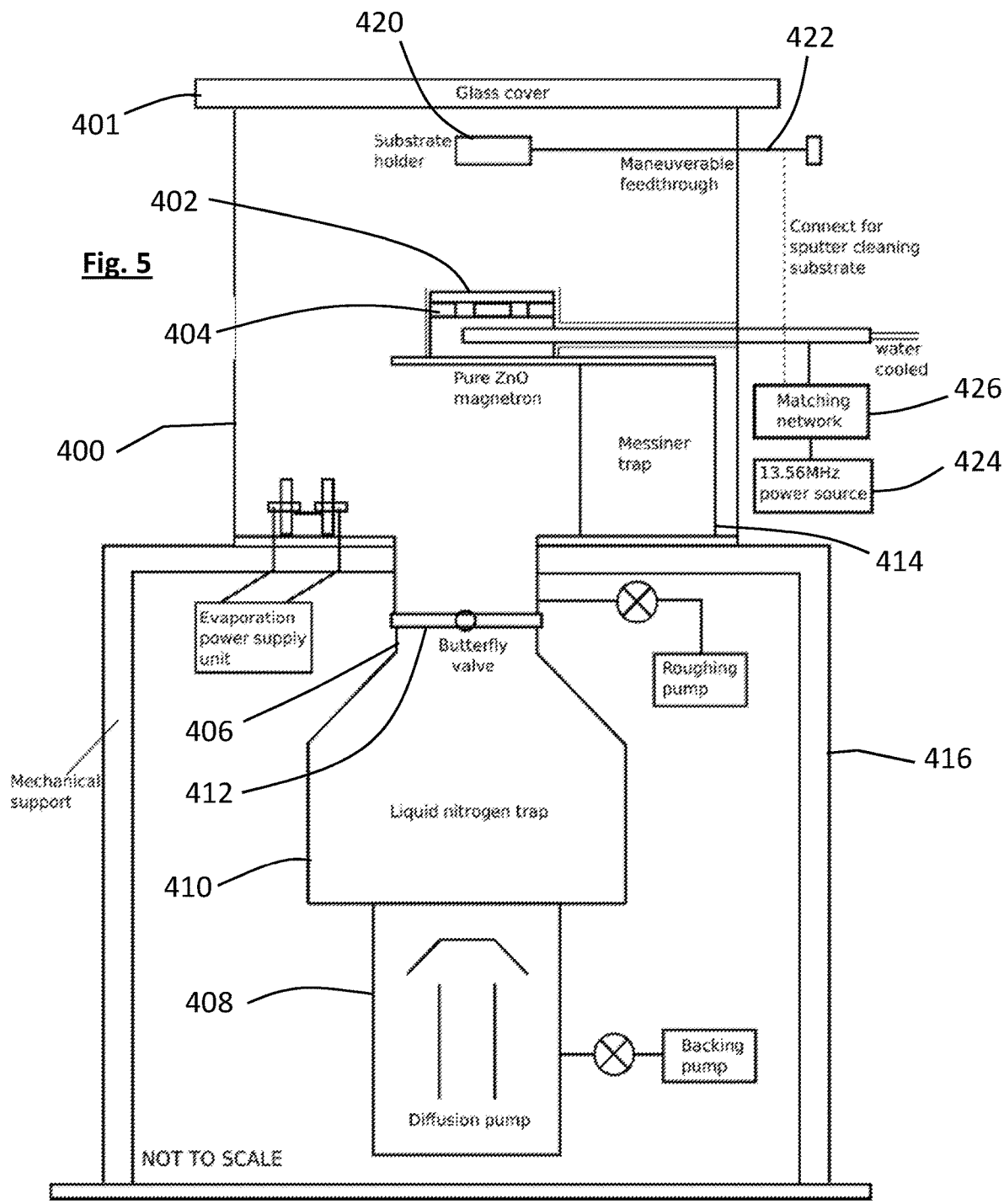
FIG. 5 shows schematically a sputtering plant suitable for producing the device of FIG. 4.

Referring to FIG. 5, a sputtering plant suitable for producing the transducer 120 comprises a vacuum chamber 400, which is cylindrical and of stainless steel with a glass cover 401 in which is situated a target 402 and a magnetron 404. The chamber 400 has an evacuation port 406 that is connected to a diffusion pump 408, for example an E06 oil diffusion pump, via a liquid nitrogen trap 410. A butterfly valve 412 is provided in the evacuation port 406 to close it when the chamber 400 has been evacuated. Sputtering gas, such as an argon/oxygen mixture, can be introduced into the chamber 400 via a leak valve, and a Peltier cooler is provided to reduce the moisture content of the gas mixture before it enters the chamber 400. A Meissner trap 414 is provided in the chamber 400, and cooled by liquid nitrogen, to selectively remove any residual water vapour from the sputtering gas mixture in the chamber. The chamber 400 is mounted on a mechanical support 416 with the nitrogen trap and diffusion pump 408 located below the support 410.

A substrate holder 420 is supported in the chamber 400, on a manoeuvrable feedthrough 422 above the target 402. An RF frequency power source 424, in this case operating at 13.56 MHz, is connected to the magnetron 404, and therefore to the target 402, via a matching circuit 426. The power source 424 is connectable to the substrate holder 420 for sputter cleaning the substrate, but the substrate holder is otherwise electrically floating.

Figure 6:
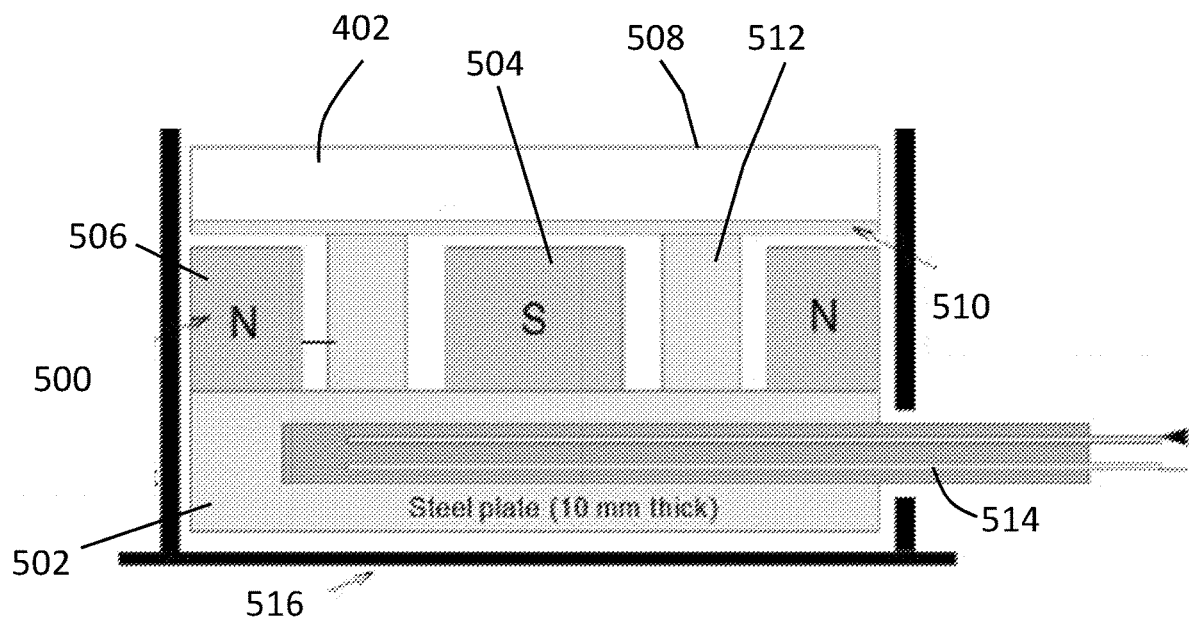
FIG. 6 is a vertical section through a magnetron forming part of the plant of FIG. 5.
Figure 7:
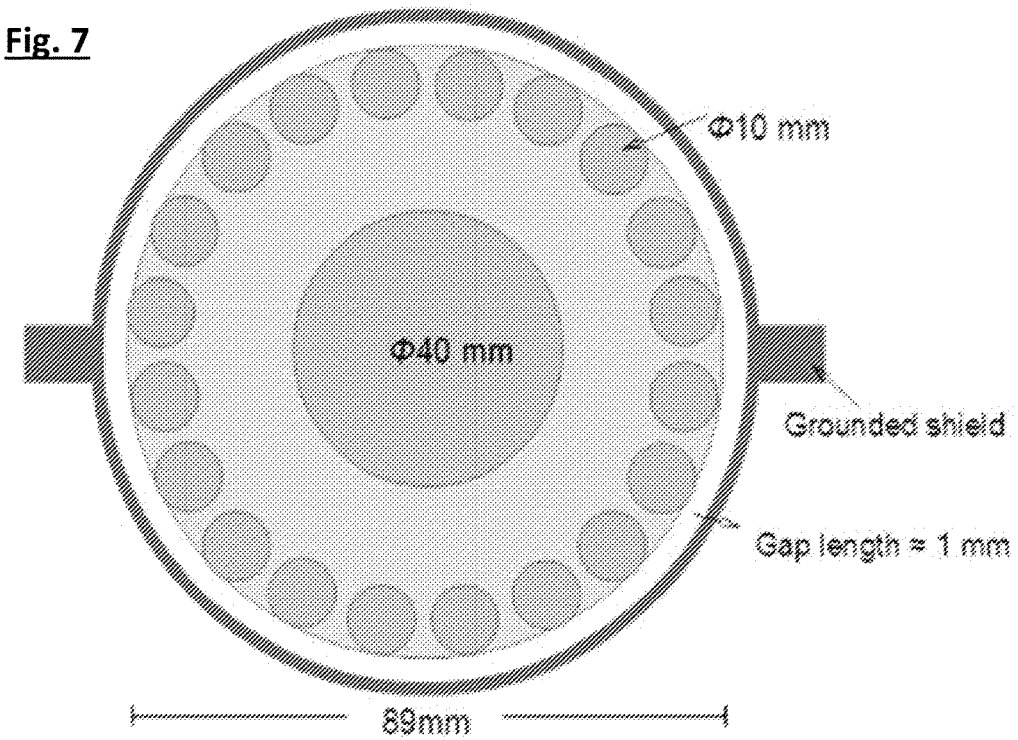
FIG. 7 is a transverse section through the magnetron of FIG. 6.

Referring to FIGS. 6 and 7, the magnetron may be designed in various ways, but in one embodiment magnets 500 of opposite polarities are arranged on a mild steel back plate 502. Specifically, a central magnet 504 is located at the centre of the back plate 502, and peripheral magnets 506 are arranged in a circle around the periphery of the back plate, with the polarity of the peripheral magnets 506 all being the same as each other, and opposite to that of the central magnet 504. The target 402, which in this case is of ZnO, is supported over the magnets 500 on the opposite side to the back plate 502 and parallel to it. At a certain radial distance r from the centre of the back plate 502, the B-field produced is parallel to the target surface 508. Since the electrons drift in the ExB direction, and the electric field is substantially normal to the target surface, or vertical as shown in FIG. 6, these electrons are confined in the ring of radius r near the target surface 508 where the plasma is at its densest. This region of the magnetron is known as the racetrack and it corresponds to maximum target erosion. The magnets 500 are strong N42 neodymium iron boron (NdFeB) permanent magnets which provide confinement of a dense plasma.

The ratio of the target diameter to thickness is kept as high as possible. This geometry tends to enhance the field near the racetrack, thus giving stronger plasma confinement. It has the disadvantage that the thin targets necessarily employed have a limited lifetime. A large diameter target is therefore desirable to allow a target thickness of at least 5 mm and hence a reasonable working life. The ZnO target in the embodiment shown has a diameter of 89 mm and a thickness of 6.6 mm.

A thermally and electrically conducting silver-loaded epoxy glue may be used to attach the back of the target 402 to a copper disk 510 which may be soldered onto a brass annulus 512. The annulus 512 may be mounted on the back plate 502 between the central and peripheral magnets 504, 506. This whole target unit may be fitted to the magnetron assembly using two screws, which allows the targets to be conveniently interchangeable.

The magnetron is water cooled using a cooling circuit 514 in the back plate 502 to avoid overheating of either the target material (which causes cracking) or the magnet (residual magnetization degrades at high temperature). A vacuum gap is engineered between the annulus and the NdFeB to avoid heat transfer from the hot target.

A grounded shield 516 is arranged close to the target 402, extending behind the back plate 502 and around the sides of the magnetron 404, to avoid plasma from striking at the back of the magnetron. This prevents unwanted sputtering and thus minimizes the impurities introduced to the fabricated film.

In operation, the electric field generated by the power source 424 acts as a trap for any free electrons in the chamber 400 and imparts an oscillating kinetic energy to them in one dimension. Quasi-elastic collisions with gas atoms feed this energy progressively into the other two dimensions where it accumulates until the electron acquires enough energy to ionise a gas atom, thereby triggering another identical process and hence a chain reaction which then maintains the sputtering plasma. The positive-going excursions of the target suck in bursts of highly mobile electrons in the plasma. The target is thus set at a negative DC voltage so the positive ions are strongly attracted towards the target surface. They thus bombard the target and transfer their momentum to the ejected surface atoms. These ejected atoms migrate to the adjacent substrate and a thin film is produced as these atoms reform on the substrate surface.

Sputtering is performed in a vacuum chamber at a working pressure that is typically in the range from 1 mtorr to 50 mtorr. The low pressure allows the sputtered particles to travel directly to the substrate without hitting other gas molecules on the way. During the sputtering process, ions and molecules in the sputtering plasma eventually de-excite emitting photons that give rise to a glow that enables the plasma location and characteristics to be visually monitored. A satisfactory ZnO sputter discharge in an Ar/O2 gas mixture has an easily recognised lilac glow.

In order to grow high quality ZnO films, the sputtering conditions need to be controlled. During growth of ZnO films in an $Ar/O_2$ sputtering environment, the substrate is bombarded by negative oxygen ($O^-$) ions and positive ions from the ionised gas. The positive ions are accelerated towards the substrate with an energy $e(V_{s,DC}-V_{f,DC})$ (of the order of 10 eV) which is the DC component of the difference in potential between the plasma (which can be measured for any system using a Langmuir probe) and the substrate. The power of the ion bombardment of the substrate per unit area is hence proportional to J $(V_{s,DC}-V_{f,DC})$ where J is the ion flux rate in the plasma. Tests using the system of FIGS. 4 and 5 to grow c-axis oriented ZnO films, showed that for any deposition rate of ZnO, reducing the energy $e(V_{s,DC}-V_{f,DC})$ and the ion flux J, and therefore reducing the ion bombardment power, tends to improve the crystal quality, as measured using X-ray diffraction. Therefore, in general terms we can define a parameter:

$$\Xi = J(V_{s,DC}-V_{f,DC})/D,$$

where D is the deposition rate of ZnO onto the substrate, and as shown in FIG. 6, minimizing the parameter Ξ will tend to maximise the quality of the ZnO transducer element. It was shown that good quality transducers can be made by keeping Ξ below $1.3*10^{26}$ $Vm^{-3}$.

Hence, an unbalanced ZnO magnetron which promotes ion bombardment of the substrate is therefore not conducive to growing c-axis oriented ZnO films. It is believed that the best growth conditions for c-axis oriented ZnO films could be more easily achieved by using a balanced magnetron in a sputtering condition with high substrate target distance, high power and low pressure. A balanced magnetron (which can be achieved by making the area of the ring pieces and the central magnet roughly equal) with strong magnetic field confinement prevents charge species from escaping the target region so that a nearby substrate can simultaneously enjoy the benefit of high growth rate and low ion bombardment that are the key to making high quality c-axis oriented piezoelectric films.

Figure 8:
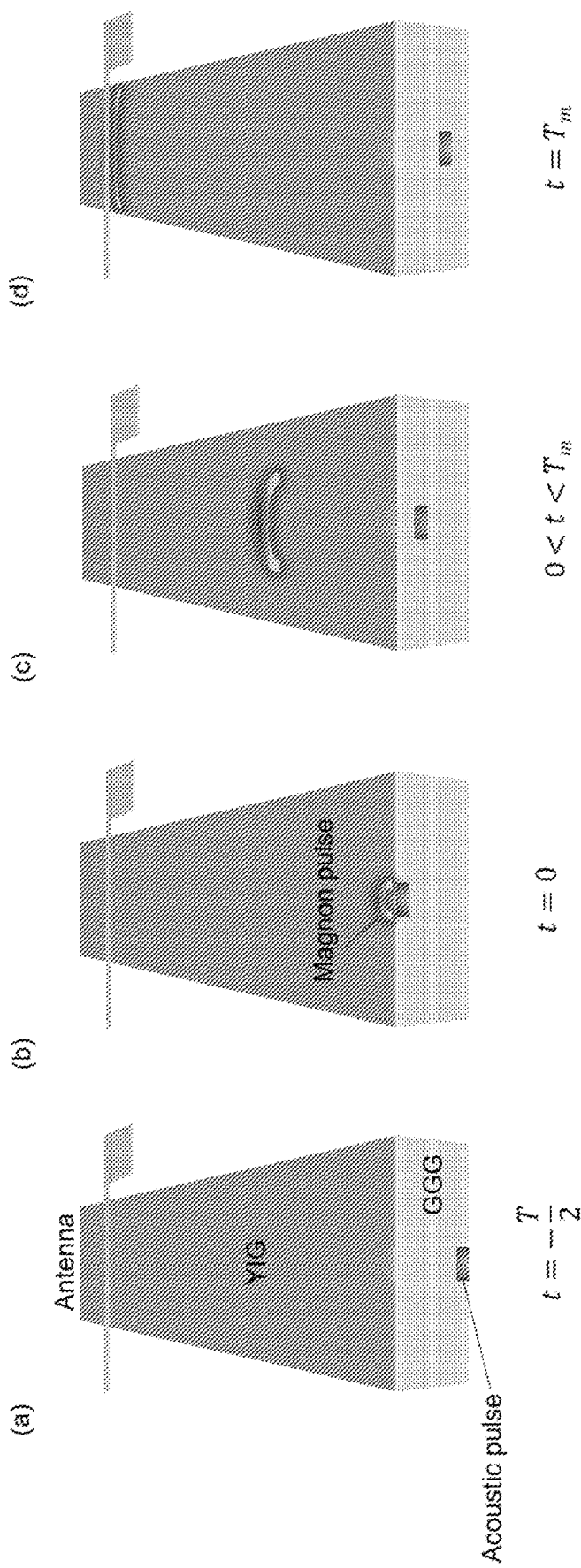
FIGS. 8a to d show a sequence of events in the operation of the apparatus of FIG. 2.

Referring now back to FIG. 2, to demonstrate that magnons can be excited by acoustics, a magnon launcher as shown in FIG. 2 was produced in which a row of identical transducers 120 were formed on the back surface 112 of the substrate 104, spaced apart along the <1 $\bar{1}$ 0> direction of the GGG crystal, i.e. along the direction of propagation of magnons and along the length of the waveguide. An antenna 116 was formed across the waveguide on the YIG film 102. The antenna comprised a thin wire and was connected to an amplifier and a rectifier and a digital oscilloscope used to measure the resultant signal. This allowed MSWs, which generate oscillating electric signals in the antenna, to be detected. The temporal response of the waveguide when it was subject to an acoustic pulse excitation was then monitored. The sequence of events that occur in such a system after the acoustic wave is launched is shown in FIG. 8, in which only one of the transducers is shown. Firstly, at time t=−T/2, where T is the round trip time of the acoustic wave from the transducer 120 back to the transducer 120 after reflection from the outer surface of the waveguide, a BAW pulse is launched by applying a 15 ns pulse of 3 GHz carrier to the top electrode of a ZnO transducer 120. After time T/2 (t=0), the acoustic pulse, having passed through the YIG inner surface 106 and propagated through the YIG, is reflected from the YIG outer surface 108, setting up a standing wave in the YIG waveguide and thereby creates a lateral propagating spin-wave. This wave propagates along the waveguide, and after a time $T_m$ (at t=$T_m$), the wave is picked up by the antenna 116 and is converted into an electromagnetic signal. This signal is subsequently processed with appropriate amplification and rectification and is monitored using a fast digital oscilloscope. As the reflected acoustic wave returns into the transducer 120 at t=T, the acoustic echo signal is detected using the transducer 120, and the acoustic wave is reflected back towards the YIG waveguide. This cycle repeats until the acoustic wave fades out due to round-trip attenuation.

Figure 9:
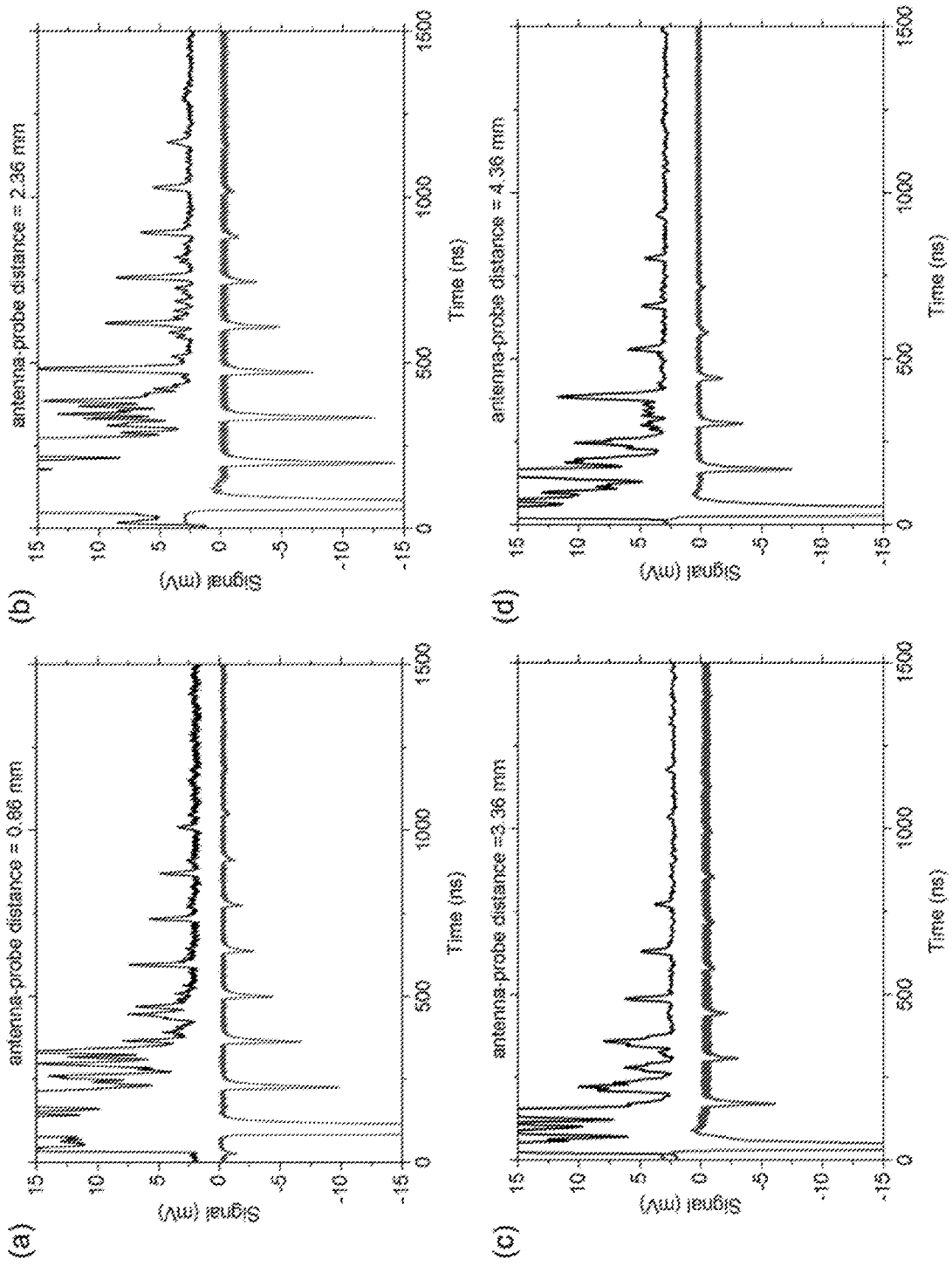
FIGS. 9a to d show signals from the piezoelectric device and detector aerial in the apparatus of FIG. 2 during operation.
Figure 11:
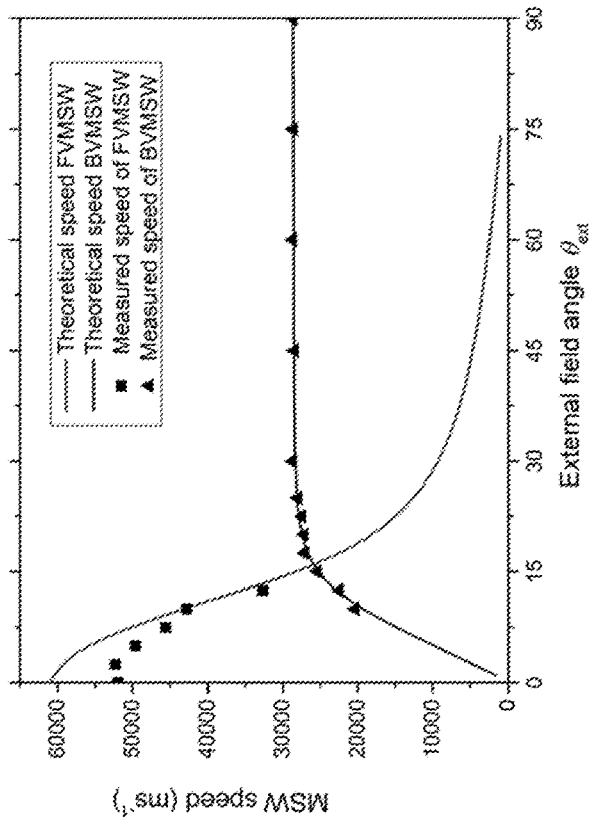
FIG. 11 is a graph of calculated and measured speeds of MSWs as a function of external magnetic field angle.

The acoustic pulse response of the waveguide at a top dot-antenna distance of 0.86 mm (by choosing to contact the transducer that is closest to the antenna) was first measured and the magnetic field was tuned such that a 3 GHz magnon signal can transmit through the YIG waveguide. FIG. 9(a) shows in its top half the plot of the output antenna data at B=90 mT and $\theta_{ext}$=30° at the antenna-transducer distance of 0.86 mm; the echo signals of the phonons are also plotted in the bottom half of the same graph for comparison. It can be clearly seen that for every acoustic echo, there is a corresponding magnon signal. The acoustic wave decays exponentially as expected due to attenuation and the generated magnons also decays proportionally. The magnon transit time was measured by finding the difference in time between the middle point of two consecutive acoustic echoes (in the time at which the phonons hit the YIG) and the time of arrival of the magnon signal. This measurement gives 27.8 ns which agrees with the predicted result according to our calculation of the magnon velocity for FVMSW as shown in FIG. 11.

It will be noted in FIG. 9a that there are some spurious signals near the point when the electromagnetic signal is injected initially. This is caused by two effects. Firstly, there is a direct electromagnetic coupling between the contact and the antenna and thus a signal is measured at almost exactly the instant at which the input acoustic signal is launched. Secondly, the stray electromagnetic field of the probe extends far away spatially, so spin-waves can be excited near the antenna; this accounts for the spin-wave signals that are measured shortly after the activation of the input signal.

Figure 10:
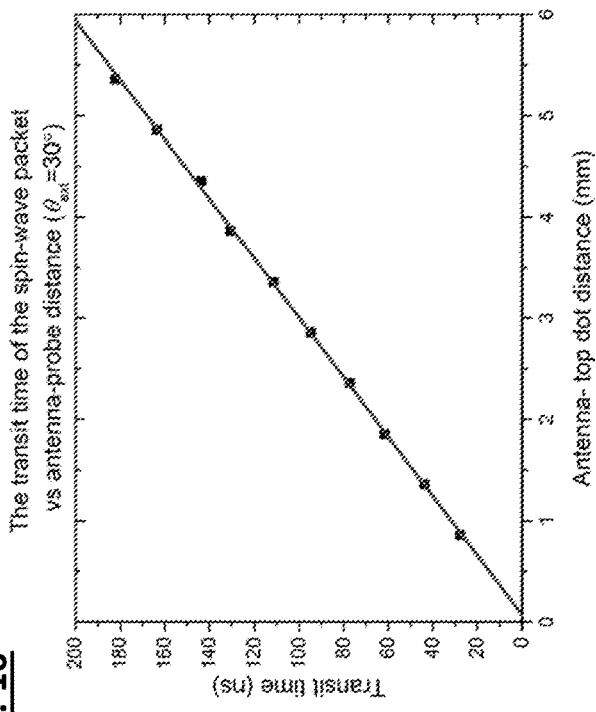
FIG. 10 is a graph of MSW transit time as a function of distance travelled as measured using the apparatus of FIG. 2.

To confirm that what we observed is unambiguously the magnon signal is generated by the phonons, we repeated the experiment at various top dot-antenna distances while keeping $\theta_{ext}$ fixed at 30°. We grew the transducers such that the top dots are 0.5 mm apart so that the magnons are excited from fixed and known top dot-antenna distances (0.86 mm+(p−1)×0.5 mm) where p=1, 2 . . . is the number of dots counted from the antenna 116. As we excited the magnons further and further away from the receiving output antenna, it can be seen that the corresponding magnon peak moved to a later time, also shown in FIG. 9(*b*), (*c*), (*d*). FIG. 10 shows the dependence of the magnon transit time on the top dot-antenna distance. It is clear from the FIG. 10 that the transit time scales linearly with the distance the magnon travels, and the most important observation lies in the fact that the y-intercept of the plot is very close to zero (only around −2.5 ns), which suggests that the magnons are indeed generated as the phonons hit the YIG waveguide 102.

Considerable acoustically excited magnons can be measured when the bias external field is held at an intermediate angle to the YIG waveguide, i.e. when $\theta_{ext}$ is neither 0° or 90°. For example in the system of FIG. 2, the optimum angle $\theta_{ext}$ may be between 5° and 30°.

Referring back to FIG. 9 we experimentally measured the magnon transit time by finding the difference in time between the middle point of two consecutive acoustic echoes (i.e. the time at which the phonons hit the YIG) and the time of arrival of the magnon signal. We found that this measurement gives 27.8 ns which agrees with predicted result according to earlier measurement and calculation of the magnon velocity as shown in FIG. 11.

As indicated above, the acoustic-magnon excitation mechanism is not only applicable for MSW, and it is also possible to excite short wavelength, exchange magnons using the same approach. This can be achieved by, for example using a miniaturised transducer, corresponding to that of FIG. 4*a* but on a smaller scale, or by patterning nanostructures with dimensions comparable to the spin wave wavelength on to the opposing side of the transducer (i.e. on the YIG side of the waveguide for example).

Referring to FIG. 12(*a*), a piezoelectric detector for MSWs can be designed using similar principles to the launcher of FIG. 2. The detector may be formed on a waveguide 600, which may comprise a magnetic material 602, again such as YIG, on a substrate 604 such as GGG. The detector 601 may comprise a piezoelectric element 606 and an electrically conductive element 608. The conductive element 608 may have an inner part 610 which may be formed on the surface of the waveguide 600, and which extends between the waveguide and the piezoelectric element 606, and an outer part 612 which is formed on the outer surface of the piezoelectric element 606 furthest from the waveguide 60, with the inner and outer parts 610, 612 being connected together by a connecting part 614 which extends round one side of the piezoelectric element 606. The inner and outer parts 610, 612 therefore act as electrodes which, if a potential difference is set up between them, will apply an electric field to the piezoelectric element.

The conductive element 608 may be formed of gold or another highly conductive metal. The piezoelectric element 606 may be formed of ZnO or another piezoelectric material. The method of forming the detector may be similar to that described above for forming the transducer 120, and the resulting size of the detector may be of the order of hundreds of nanometres in length and width, the piezoelectric element may be of the order of 1000 nm thick and each part of the conductive element may be around 25 nm thick.

The waveguide is arranged so that MSWs will propagate along its length in a propagation direction indicated by 616 (into the page in the diagram) which is perpendicular to the loop defined by the 'C' shaped electrode of the detector.

The detector 601 works by generating elastic waves, i.e. phonons, in response to the transmission of MSWs along the waveguide 600. As MSWs propagate past the detector, the oscillating magnetic field of the MSWs induces an oscillating electric current in the conductive element 608, which generates an oscillating electric potential difference between the inner and outer parts 610, 612 of the conductive element. This potential difference is applied as a voltage across the piezoelectric element 606 which therefore generates elastic waves 618 propagating perpendicular to the inner and outer surfaces of the YIG waveguide and the surfaces of the substrate 604.

A further piezoelectric detector 620 may be mounted on the back surface of the substrate 604 which picks up the elastic waves and generates an electric output signal which can then be processed by a suitable device such as an oscilloscope to form an electrical detector output. As the two detectors 601, 620 are located on opposing surfaces of the waveguide 600, the elastic waves detected by the detector 620 are those which are propagated across the waveguide 620 in the direction perpendicular to the two opposing surfaces of the waveguide.

Referring to FIG. 12*b*, an alternative way to convert magnons into phonons is to use magnetostrictive elements. The magnon-phonon convertor can be formed by depositing a magnetostrictive element 622 on top of the surface of a magnonic waveguide 102 (e.g. the surface of the YIG thin film). The stray field of the spin-wave propagating along the waveguide with then induce an oscillating stress in the magnetostrictive element 622 which leads to phonon generation. The convertor can then be used as an effective bulk acoustic wave generator which generates acoustic waves perpendicular to the surface of the waveguide substrate. A further piezoelectric detector 620 mounted on the back side of the waveguide can be used to detect the acoustic wave generated as described above with reference to FIG. 12*a*.

The magnetostrictive 622 element may be produced very simply. Suitable materials include iron, nickel, and terbium-iron alloys. The magnetostrictive element 622 may be formed simply by forming a small block of the material on the surface of the waveguide.

Referring to FIG. 13 while many applications of the MSW launcher will be in thin film waveguides, elastic waves can also be used to generate MSWs in a bulk three-dimensional body 700 of magnetic material. In this case, rather than whole thickness of the magnetic material being used to set up a standing wave, the magnetic material has structural features formed in it which are sized so as to perform the same function as the thin film 102 of FIG. 2. For example, a simple rectangular recess 702 may be formed in one surface 708 of the magnetic material 700, and a coating of material of a different acoustic refractive index formed on the surface 708 so that it covers the surface and fills the recess 702. The magnetic material may be YIG and the coating material may be ZnO which is significantly softer than YIG. Alternatively the coating material may be gold or another material having a pronounced spin-orbit interaction. The coating material may in some cases cover or fill the surface feature, such as the recess 702 and not the extend over the rest of the surface 708 of the magnetic material.

Alternatively it may extend over the surface 708 of the magnetic material, but not fill or extend over the surface feature or recess 702.

Other shapes of surface feature, such as a tapered recess 720 or a rounded or hemispherical recess 722 can also be used in place of, or as well as, rectangular recesses 720.

A piezoelectric transducer 704, which may be the same as those described above with reference to FIG. 4, may be formed on another surface 706 of the magnetic material 700, and arranged to generate elastic waves in the magnetic material propagating towards the recess 702. The two surfaces 706, 708 may be parallel to each other, but in general this is not a requirement. When the transducer 604 transmits elastic waves through the magnetic material 600 so that they reach the recess 602, the elastic waves are reflected from the surface 608 and also impinge on the recess or recesses 702, 720, 722. These surface irregularities form symmetry breakers which result in the generation of spin waves where the elastic waves interact with the surface irregularities. The resulting spin waves can propagate out from the surface irregularity in a range of directions through the three dimensional body of magnetic material.

The surface features 702, 720, 722 have a size which can be characterized by the maximum distance they extend from plane of the surface 708 into the body 700 in the direction perpendicular to the surface 708. This can be referred to as the depth of the surface feature. The size can also be characterized by a maximum width, i.e. the maximum width of the feature in any direction parallel to the pane of the surface 708. Either one or both of these dimensions may be selected so as to be in the nanometer range so as to be small enough to enable excitation of small wavelength exchange dominated spin waves, but larger than the lattice parameter of the magnetic material. For example either one or both of these dimensions may be less than 1 μm, or less than 500 nm, but will generally be greater than 10 nm.

The invention claimed is:

1. Apparatus for generating spin waves, the spin waves comprising phase-coherent precession of coupled magnetic spins of electrons, the apparatus comprising a body of magnetic material and an elastic wave generator, wherein the body has a surface and the elastic wave generator is arranged to transmit elastic waves so that they propagate through the body towards the surface and are reflected at the surface to form a standing elastic wave in the body, thereby generating the spin waves in the body.

2. Apparatus according to claim 1 wherein the body comprises a film having two opposite surfaces and the elastic wave generator is arranged to transmit the elastic waves in a direction perpendicular to the surfaces.

3. Apparatus according claim 2 wherein the film has a thickness and the wavelength of the elastic waves in the body is of the order of the film thickness.

4. Apparatus according to claim 2 further comprising a substrate having a first side and a second side which is opposite to the first side, wherein the film is formed on the first side of the substrate and the elastic wave generator is formed on the second side of the substrate.

5. Apparatus according to claim 2 wherein the film is in the form of a strip having a length, and the spin waves can propagate along the length of the strip.

6. Apparatus according to claim 2 wherein the film is in the form of a layer in which the spin waves can propagate in at least two substantially perpendicular directions.

7. Apparatus according to claim 1 wherein: the surface has a surface feature therein, the elastic wave generator is arranged to transmit the elastic waves so that they propagate in a propagation direction towards the surface feature, whereby the elastic waves interact with the surface feature to generate spin waves, the apparatus further comprises a further material extending over at least one of the surface and the surface feature, the body has an acoustic refractive index, and the further material has an acoustic refractive index which is different from that of the body.

8. Apparatus according to claim 7 wherein the further material is a single material, extends over the surface and the further material, and has a pronounced spin-orbit interaction.

9. Apparatus according to claim 7 wherein the surface feature is a recess in the surface.

10. Apparatus according to claim 7 wherein the surface feature has a maximum dimension of no more than 100 nm.

11. Apparatus according to claim 1 wherein the elastic wave generator is a piezoelectric device comprising a piezoelectric element and two electrodes arranged to apply an electric field across the piezoelectric element to generate the elastic waves, and a DC voltage source arranged to apply a variable DC electric field to the piezoelectric element thereby to shift the phase of the elastic waves.

12. Apparatus according to claim 11 wherein the piezoelectric element has two opposite sides and the electrodes are each on a respective one of said opposite sides.

13. Apparatus according to claim 11 wherein the piezoelectric element has two opposite sides and the two electrodes are on a first one of said two opposite sides and arranged to have an oscillating voltage applied between them, and a further electrode is provided on a second one of said two opposite sides so that capacitive coupling between the further electrode and one of said two electrodes produced an electric field across the piezoelectric element.

14. Apparatus according to claim 1 further comprising a phase shifting device located between the elastic wave generator and the body of magnetic material, the phase shifting device comprising a piezoelectric element and electrodes to which a voltage can be applied to vary a dimension of the piezoelectric element.

15. A method of generating spin waves, the spin waves comprising phase-coherent precession of coupled magnetic spins of electrons, the apparatus comprising providing a body of magnetic material having a surface, applying a magnetic field to the magnetic material, and transmitting elastic waves so that they propagate through the body towards the surface and are reflected at the surface to form a standing elastic wave in the body, thereby generating the spin waves in the body.

16. A method according to claim 15 wherein the elastic waves are generated using a piezoelectric device comprising a piezoelectric element and two electrodes arranged to apply an electric field across the piezoelectric element to generate the elastic waves, and the method further comprises applying a varying DC electric field to the piezoelectric element thereby to shift the phase of the elastic waves and the spin waves.

* * * * *